US007011484B2

(12) United States Patent
Lee

(10) Patent No.: US 7,011,484 B2
(45) Date of Patent: Mar. 14, 2006

(54) END EFFECTOR WITH TAPERED FINGERTIPS

(75) Inventor: Kuei-Hung Lee, Taichung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 145 days.

(21) Appl. No.: 10/044,014

(22) Filed: Jan. 11, 2002

(65) Prior Publication Data

US 2003/0133776 A1 Jul. 17, 2003

(51) Int. Cl.
*B25J 7/00* (2006.01)

(52) U.S. Cl. ............ 414/416.03; 294/1.1; 414/416.08; 414/937

(58) Field of Classification Search ................ 294/1.1, 294/64.1; 414/416.03, 416.08, 937, 938
See application file for complete search history.

(56) References Cited

U.S. PATENT DOCUMENTS

| | | | | |
|---|---|---|---|---|
| 4,620,738 A | * | 11/1986 | Schwartz et al. | 294/64.1 |
| 4,676,884 A | * | 6/1987 | Dimock et al. | 204/298 |
| 4,687,242 A | * | 8/1987 | Van Rooy | 294/64.1 |
| 5,292,222 A | * | 3/1994 | Malagrino et al. | 414/786 |
| 5,636,964 A | * | 6/1997 | Somekh et al. | 414/806 |
| 5,647,626 A | * | 7/1997 | Chen et al. | 294/87.1 |
| 5,746,460 A | * | 5/1998 | Marohl et al. | 294/1.1 |
| 5,755,469 A | * | 5/1998 | Choi et al. | 294/1.1 |
| 5,765,889 A | * | 6/1998 | Nam et al. | 294/64.1 |
| 5,853,532 A | * | 12/1998 | Nakamura et al. | 156/584 |
| 5,906,469 A | * | 5/1999 | Oka et al. | 414/416.08 |
| 5,953,107 A | * | 9/1999 | Li et al. | 355/77 |
| 6,024,393 A | * | 2/2000 | Shamlou et al. | 294/64.1 |
| 6,032,994 A | * | 3/2000 | Chen et al. | 294/1.1 |
| 6,068,316 A | * | 5/2000 | Kim et al. | 294/64.1 |
| 6,095,806 A | * | 8/2000 | Suzuki et al. | 432/241 |
| 6,203,617 B1 | * | 3/2001 | Tanoue et al. | 118/695 |
| 6,327,973 B1 | * | 12/2001 | Duis et al. | 101/41 |
| 6,331,023 B1 | * | 12/2001 | Goodwin et al. | 294/1.1 |
| 6,415,843 B1 | * | 7/2002 | De et al. | 156/584 |
| 6,692,214 B1 | * | 2/2004 | Shida et al. | 414/416.03 |

\* cited by examiner

*Primary Examiner*—Thomas J. Brahan
(74) *Attorney, Agent, or Firm*—Tung & Assoc.

(57) ABSTRACT

An apparatus for transporting a flat object from one position to another position. The apparatus includes an end effector having a base portion and at least one finger extending from the base portion. The finger having a top surface and a bottom surface, and the finger including a free end. The top surface includes a substantially flat portion extending from the base portion, and wherein the finger includes a tapered portion extending from the substantially flat portion towards the free end.

16 Claims, 2 Drawing Sheets

END EFFECTOR WITH TAPERED FINGERTIPS

FIELD OF THE INVENTION

This invention relates to a wafer handling system, and more particularly to a wafer handling system having an end effector with tapered fingertips.

BACKGROUND OF THE INVENTION

In the fabrication of microelectronic devices such as integrated circuits, an electronic substrate such as a wafer must be processed in numerous processing steps, which in some cases may include as many of several hundred processing steps. During each of the processing step, the silicon wafer must be transported in and out of specific process machines such as an etcher, a physical vapor deposition chamber, a chemical vapor deposition chamber, etc. Between the processing steps, a preprocessed wafer is stored in a storage container referred to as a wafer cassette. The wafer cassette is then stored in a container known as a pod to prevent contamination.

The wafer cassette is a device that is normally molded of a plastic material which can be used to store a large number of wafers in a horizontal position. In order to maximize the number of wafers that can be stored in a cassette, the wafers are positioned relatively close to each other. For instance, the pitch distance between the wafers is approximately 2 mm in a normal cassette. The wafers, when stored in the cassette are supported along the wafer edges by molded-in supports on the inner walls of the cassette.

In order to load a wafer into or out of a process machine or wafer cassette, a device known as a wafer transport blade, wand or end effector is typically used. An end effector is a thin piece of material that may be formed in any of a variety of shapes but preferably includes a base portion with extensions commonly known as fingers. An end effector is an attachment to a robotic arm that is used to transport silicon wafers, hard drive disk, or flat-panel substrates from one location to another. The end effector can be supplied for vacuum or non-vacuum applications, and may also include wafer edge gripping clamps. An end effector may be made from ceramic materials such as alumina or silicon carbide, or a metal such as aluminum.

As indicated earlier, the processing of the silicon wafer involves moving the wafer from a cassette to various processing locations by a robotic handling system. The robotic handling system includes a mechanism with degrees of freedom in at least radial, angular and vertical directions with the end effector attached to the end of a robotic arm. The robotic arm must be able to pick up the wafers from the cassette and then transfer them to the designated stations where the wafer undergoes a variety of process steps. The robotic mechanism and its associated controller must be programed with the precise location in terms of radial, angular and vertical positions of the wafer in all cassette locations and all processing station locations. A robotic mechanism controller, such a central processing unit, includes programmed data to locate and retrieve the wafer precisely from the cassette or processing station.

In a typical wafer processing layout, the locations of various process stations and the cassette stand are known, and the dimensional relationships between the wafer positions in the cassette, each process station location and the robotic arm are known within macro-tolerances, for example within 0.05 inches. However, the robotic arm must be controlled to move the wafers within extremely close tolerances, that is within micro-tolerances, in order to prevent damage to the robotic system including the end effector, wafers, the wafer cassette or other semiconductor processing equipment.

Typically, the robotic system is set up and pre-programmed with the location of the wafer positions within the cassette stand, the location of the cassette stand, and other process stations using macro-tolerances. Thereafter, the robot must be programmed or taught so that the robot arm and end effector are precisely positioned during each of the operation steps within micro-tolerances. A typical way of accomplishing this is to manually move the robotic arm and end effector to each location within the wafer handling process and make adjustments to the robotic mechanism and control system. Once the end effector is properly located for each process handling step the precise positions are then stored in the memory of the wafer handling mechanisms controller.

However, occasionally a piece of the processing equipment such as a wafer cassette may not be precisely positioned within specifications, or the machine components wear, settle, malfunction, or components are replaced resulting in the robotic control arm not being able to move to precisely the correct position for handling the wafer. Often, such situations require the robotic mechanism to be reprogrammed to accommodate the new changes and new locations. However, in the case of component wear, equipment settling or malfunction, the robotic mechanism operator is not aware of the situation until one of the process equipment components or the end effector is damaged. The end effector is often damaged by bumping into the wafer cassette or the wafer itself resulting in the end effector finger extensions being broken off.

Thus it would be desirable to provide a wafer handling system that would be able to accommodate component locations that are mis-programmed into the wafer handling controller, changes in the location of the robotic arm, end effector or other processing components due to wear, settling, or malfunction in the same without resulting in damage to the wafer processing components including the end effector. The present invention provides alternatives to and advantages over the prior art.

SUMMARY OF THE INVENTION

One embodiment of the invention includes an apparatus for transporting a flat object from one positioned to another position. The apparatus includes an end effector having a base portion and at least one finger extending from the base portion. The finger includes a top surface and bottom surface and a free end. The top surface includes a substantially flat portion extending from the base portion, and the finger includes a tapered portion extending from a substantially flat portion towards the free end.

In another embodiment of the invention the tapered portion including an angled surfaces formed at an angle ranging from about 2–8 degrees with respect to the substantially flat portion.

In another embodiment of the invention that thickness of the finger between the substantially flat portion of the bottom surface ranges from about 1.8–1.95 mm.

In another embodiment of the invention two spaced apart fingers extend from the base portion.

In another embodiment of the invention the tapered portion includes an angled surface formed at an angle ranging from about 4–5 degrees with respect to the substantially flat portion.

In another embodiment of the invention the length of the tapered portion ranges from about 3–8 mm.

In another embodiment of the invention of finger further includes a vacuum port hole formed therein for drawing a vacuum therethrough and gripping a flat object.

In another embodiment of the invention the end effector is made from a material comprising a ceramic.

In another embodiment of the invention the ceramic comprises at least one of alumina and silicon carbide.

In another embodiment of the invention the end effector is made from a material comprising a metal.

In another embodiment of the invention the metal comprises aluminum.

Another embodiment of the invention further includes a robot having a robotic arm and wherein the end effector is attached to an end of the robot arm. The robot arm is constructed and arranged to move the end effector in a plurality of directions.

Another embodiment of the invention includes an apparatus having a robot with the robot arm for movement in a plurality of directions, and an end effector secured to an end of the robot arm. A wafer cassette housing is provided having first and second side walls and plurality of spaced apart ledges extending inwardly from each side wall constructed and arranged so that corresponding ledges on each side wall are positioned to support a semiconductor wafer. At least two spaced apart adjacently positioned semiconductor wafers are supported by corresponding ledges in the wafer cassette housing to define an opening between adjacently positions semiconductor wafers. An end effector having at least one extension and wherein each extension includes a top surface and bottom surface and the extension having a free end. The top surface having a substantially flat portion and a tapered portion extending from the substantially flat portion towards the free end. The thickness of the extension between the substantially flat portion and the bottom surface is about 0.05–0.2 mm less than the opening between the adjacently positions semiconductor wafers in the cassette housing.

In another embodiment of the invention the tapered portion includes an angled surface formed at an angle ranging from about 2–8 degrees with respect to the substantially flat portion.

In another embodiment of the invention the tapered portion includes an angled surface formed at an angle ranging from about 4–5 degrees with respect to the substantially flat portion.

Another embodiment of the invention further includes a second extension and wherein the extensions are spaced apart from each other.

In another embodiment of the invention the length of the tapered portion ranges from about 3–8 mm.

Another embodiment of the invention includes an apparatus for transporting a flat object from one positioned to another position including an end effector having a base portion and a pair of spaced apart fingers each extending from the base portion. Each finger includes a top surface and bottom surface and a free end. The top surface includes a substantially flat portion extending from the base portion. Each finger includes a tapered portion extending from the substantially flat portion towards the free end.

These and other objects, features and advantages of the present invention will become apparent from the following brief description of the drawings, detailed description of the preferred embodiments, and appended claims and drawings.

DETAILED DESCRIPTION OF THE PREFERRED EMBODIMENTS

Figure 1:
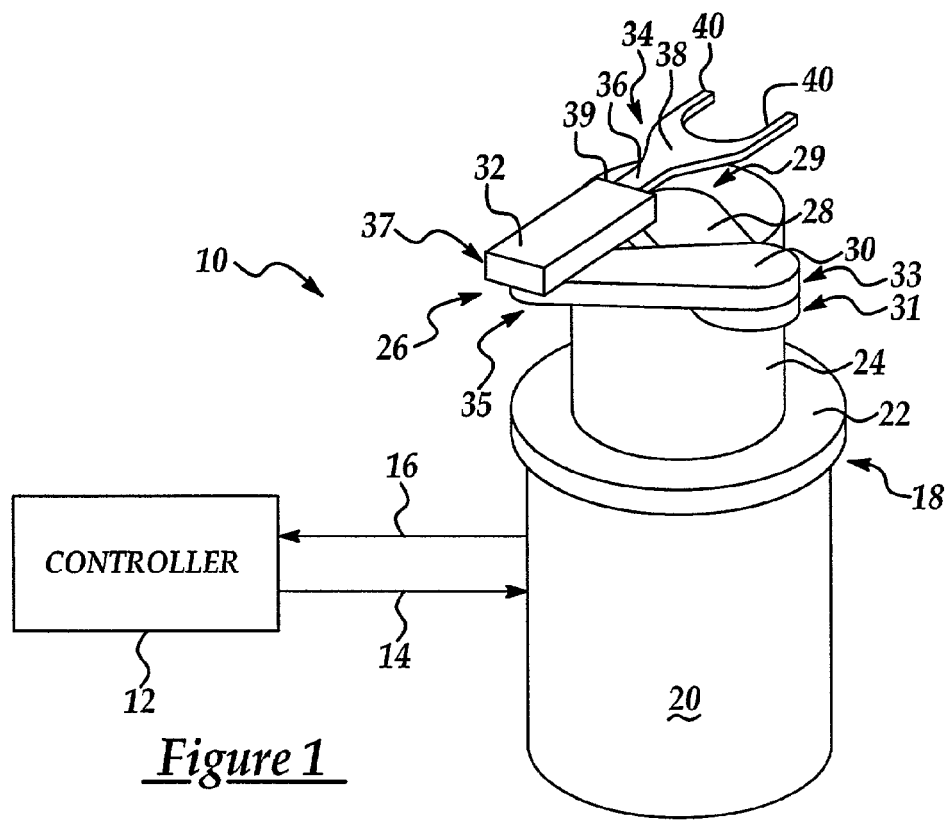
FIG. 1 is perspective view of a wafer handling system including a robot with an a robot arm and end effector attached thereto according to the present invention.

FIG. 1 illustrates a wafer handling apparatus 10 according to the present invention including a robot 18 and a controller 12 operatively connected thereto to send control signals via line 14 and receive feedback signals via line 16. The robot 18 includes a main body portion 20 having a plurality of motors, typically at least 3, to move the robot arm 26 in at least radial, angular and vertical directions. A cap 22 is provided on the main body portion 20 of the robot 18 through which a piston type actuator 24 travels to move the robot arm 26 in the vertical direction. The robot arm 26 includes a plurality of arm segments. A first arm segment 28 includes a first end 29 pivotally attached to the upper surface of the piston type actuator 24. A second end 31 of the first arm segment 28 is pivotally connected to a first end 33 of a second arm segment 30. A second end 35 of the second arm segment 30 is pivotally connected to a first end 37 of a third arm segment 32. An end effector 34 is attached to the third arm segment 30 at a second end 39 of the third arm segment 30. The end effector 34 preferably includes a handle portion 36 which is attached to the second end 39 of the third arm segment 30. The handle portion 36 is connected to a wider main body portion 38 of the end effector 34. At least one, and preferably two, fingers 40 extend from the main body portion 38 of the end effector 34.

Figure 2:
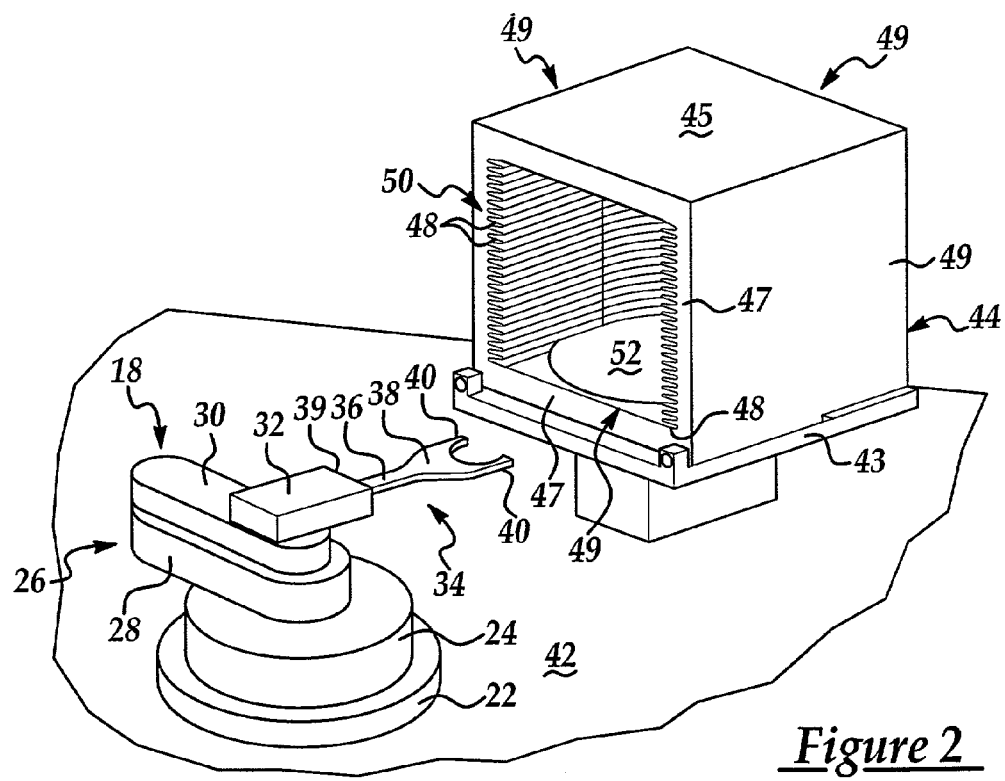
FIG. 2 is perspective view of a wafer handling system positioned to retrieve a semiconductor wafer from a wafer cassette according to the present invention.

As shown in FIG. 2, the robot 18 is typically secured to a platform such as the table 42. A station platform 43 may be provided onto which a cassette stand 44 may be attached. The cassette stand 44 typically includes a housing 45 having three side walls 49 typically formed at 90 degree angles to each other and a front face 47 having an opening 46 therein through which a semiconductor wafer 52 may be inserted and removed. The housing 45 includes spaced apart ledges 48 extending inwardly from at least two, and preferably three, of the side walls 49 to define a slot 50 between adjacently positioned ledges 48. The semiconductor wafer is inserted through the opening 46 in the front face 47 of the housing 45 into the slot 50 and rests on the ledges 48. Typically the clearance between adjacently positioned semiconductor wafers resting on the ledges 48 in the housing 45 is about 2 mm. In operation, the robot arm 26 is moved so that the end effector 34 is positioned in the slot 50 defined between adjacently positioned semiconductor wafers 52 held in the housing 45 but without touching either of the semiconductor wafers. Once positioned in the correct location, the robotic arm is moved upward so that the end effector 34 engages the semiconductor wafer 52 positioned above and lifts the wafer 52 off of the ledges 48 of the housing 45. If the end effector 34 is equipped with vacuum port holes as will be described hereafter, the vacuum is turned on so that the wafer 52 is securely gripped by the end effector 34. However, if the end effector 34 does not include vacuum port holes the wafer 52 simply rest on the main body portion 38 and the finger extensions 40 of the end effector 34. Once the wafer 52 is lifted off of the ledges 48 the robot arm 26 is retracted to remove the wafer 52 from the cassette housing 45.

Figure 3:
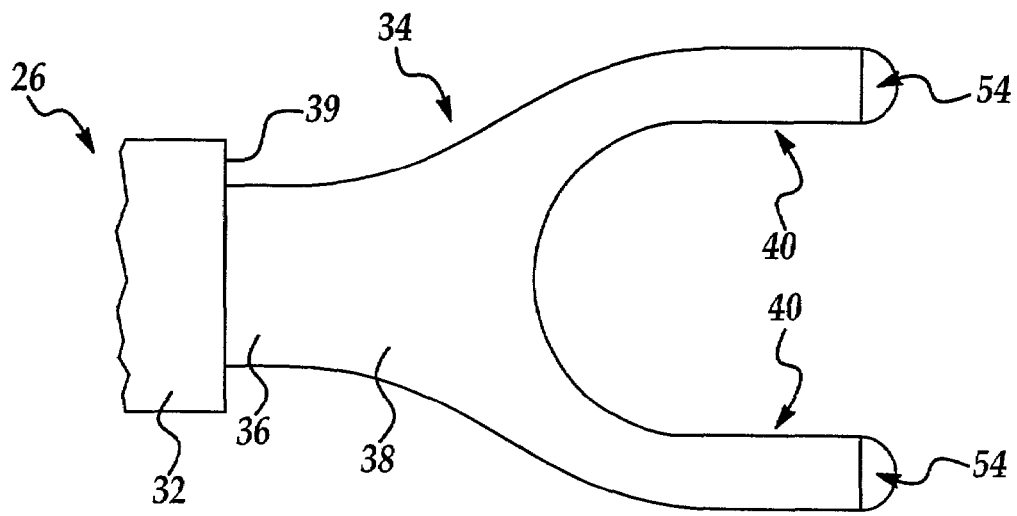
FIG. 3 is a plan view of a robot arm, with portions broken away, and an end effector attached thereto according to the present invention.

FIG. 3 is a plan view of a robot arm 26 with portions broken away and an end effector 34 with a handle portion 36 secured to the second end 39 of the third arm segment 32. As indicated earlier, at least one, and preferably two fingers 40 extend from the main body portion 38 of the end effector 34. To avoid damage to the end effector as a result of the errors in the programming of the various locations of the robot arm, end effector, wafer cassette and various processing locations, wear on the equipment, settling of the equipment, or malfunction, the end the fingers 40 extending from the main body portion 38 of the end effector 34 includes tapered tips 54.

Figure 4:
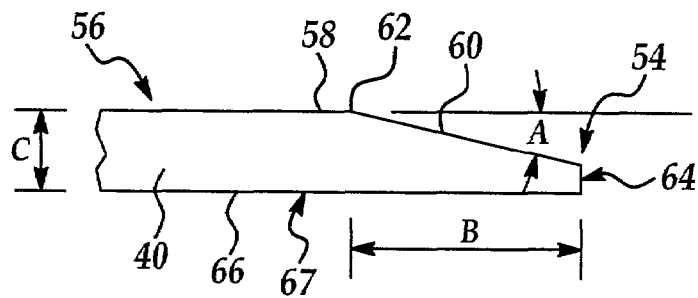
FIG. 4 is a side view, with portions broken away, of a finger extension of an end effector according to the present invention.

As shown in FIG. 4, each finger 40 extending from the main body portion 38 includes tapered fingertips 54. Each finger 40 includes a top surface 56 having a substantially flat or planar portion 58. The fingertips 54 has a tapered portion 54 having an angled surface 60 extending from the flat portion 58 towards a free end 64 of the finger 40. The angled surface 60 is formed at an angle, designated by A in FIG. 4, with respect to the flat portion 58 of the finger ranging from about 2–8 degrees, preferably about 4–5 degrees, and most preferably about 5 degrees. The length of the tapered portion 54 extending from the flat portion 58 at junction 62 to the end of the fingertip 64 may range from about 3–8 mm, preferably 4–5 mm, and most preferably 5 mm. The tapered portion 54 of the finger 40 prevents damage to the end effector by reducing the likelihood of the end 64 of the finger striking the semiconductor wafer 52 are other processing components. Further, the tapered portion 54 of the finger 40 also makes it easier for the end effector 34 to be positioned in the slot 50 defined between adjacent semiconductor wafers 52. As a result, the thickness, as designated by line C, of each finger between the flat portion 58 and corresponding flat portion 66 on the bottom face 67 of the finger 40 may be increased to slightly less than the pitch between adjacent semiconductor wafers 52, or slightly less than 2 mm. The increased thickness of the finger makes the finger stronger and less likely to break. For example, wherein the vertical space between the adjacently positioned wafers in the wafer cassette housing 55 is 2 mm, the thickness of the finger between the flat portion 58 on the top portion 56 of the finger 40 and corresponding flat portion 66 of the bottom face 67 of the finger may range from 1.8–1.95 mm, 0.05–0.2 mm less with the vertical space or opening between the adjacently positioned wafers in the wafer cassette housing 55. The increase in thickness of the wafer fingers 40 of the end effector 34 further decreases the likelihood of the fingers 40 from being broken off if the fingers 40 accidentally striking the wafer processing equipment or wafer 52.

Figure 5:
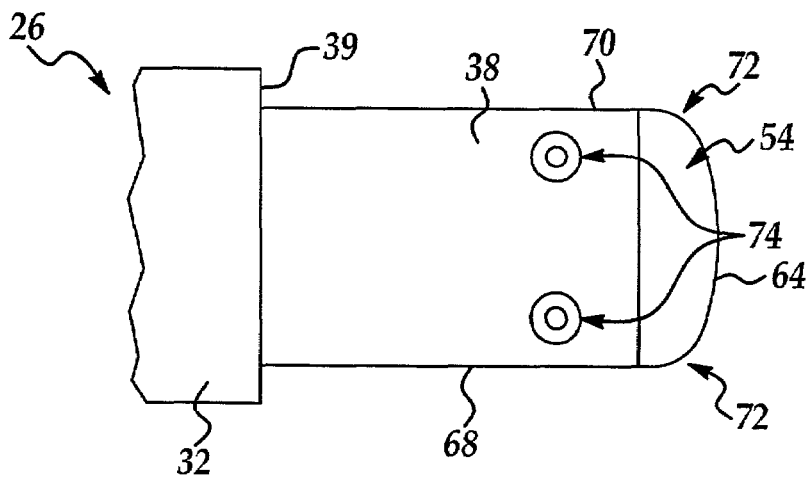
FIG. 5 is a plan view, with portions broken away, of a robotic arm with a single extension end effector according to the present invention.

FIG. 5 illustrates an alternative embodiment of the present invention. In this alternative embodiment, the end effector 34 has a blade-like configuration having a single extension or single extending finger 40. In this blade-like configuration, the main body portion 38 is connected to a first end 39 of the third segment 32 of the robot arm 26. The main body portion 38 includes sides 68 and 70 that are substantially parallel with the exception that curved corners 72 may be provided near the end 64 of the blade-like end effector. The blade-like end effector also includes a tapered portion 54 constructed substantially the same as described with respect to FIG. 4. Vacuum port holes 74 may be provided in the finger 40 through which a vacuum may be drawn to grip the semiconductor wafer 52 as desired. As indicated earlier, the finger 40 may also be provided without vacuum port holes.

What is claimed is:

1. An apparatus for transporting a semiconductor wafer from one position to another position comprising:
    an end effector having a base portion and at least one finger extending from the base portion, the finger having a top surface and a bottom surface and the finger including a free end, and wherein the top surface includes a substantially flat portion extending from the base portion, and wherein the finger includes a tapered portion extending from the substantially flat portion towards the free end;
    wherein the tapered portion includes an angled surface formed at an angle ranging from about 2–8 degrees with respect to the substantially flat portion;
    and wherein the thickness of the finger between the substantially flat portion of the bottom surface ranges from about 1.8–1.95 mm.

2. An apparatus as set forth in claim 1 wherein only a single finger extends from the base portion.

3. An apparatus as set forth in claim 1 having at least two spaced apart fingers extending from the base portion.

4. An apparatus as set forth in claim 1 wherein the tapered portion includes an angled surface formed at an angle ranging from about 4–5 degrees with respect to the substantially flat portion.

5. An apparatus as set forth in claim 1 wherein the length of the tapered portion ranges from about 3–8 mm.

6. An apparatus as set forth in claim 1 wherein the finger further includes a vacuum port hole formed therein for drawing a vacuum therethrough and gripping a flat object.

7. An apparatus as set forth in claim 1 wherein the end effector is made from a material comprising a ceramic.

8. An apparatus as set forth in claim 7 wherein the ceramic comprises at least one of alumina and silicon carbide.

9. An apparatus as set forth in claim 1 wherein the end effector is made from material comprising a metal.

10. An apparatus as set forth in claim 9 wherein the metal comprises aluminum.

11. An apparatus as set forth in claim 1 further comprising a robot having a robot arm, and wherein the end effector is attached to an end of the robot arm, and wherein the robot is constructed and arranged to move the end effector in a plurality of directions.

12. An apparatus comprising:
    a robot having a robot arm for movement in a plurality of directions, and an end effector secured to an end of the robot arm;
    a wafer cassette housing having first and second side walls and a plurality of spaced apart ledges extending inwardly from each of the side walls constructed and arranged so that corresponding ledges on each side wall are positioned to support a semiconductor wafer, and the housing having a front face with an opening formed therein for loading and unloading the cassette housing with semiconductor wafers;

at least two spaced apart adjacently positioned semiconductor wafers supported by corresponding ledges extending inwardly from the first and second side walls of the wafer cassette housing to define an opening between adjacently positioned semiconductor wafers;

an end effector having at least one extension wherein each extension includes a top surface and a bottom surface and the extension having a free end, and the top surface having a substantially flat portion, and a tapered portion extending from the substantially flat portion towards the free end, and wherein the thickness of the extension between the substantially flat portion and the bottom surface is about 0.05–0.2 mm less than the opening between the adjacently positioned semiconductor wafers in the cassette housing.

13. An apparatus as set forth in claim 12 wherein the tapered portion includes an angled surface formed at an angle ranging from about 2–8 degrees with respect to the substantially flat portion.

14. An apparatus as set forth in claim 12 wherein the tapered portion includes an angled surface formed at an angle ranging from about 4–5 degrees with respect to the substantially flat portion.

15. An apparatus as set forth in claim 12 further comprising a second extension and wherein the extensions are spaced apart from each other.

16. An apparatus as set forth in claim 12 wherein the length of the tapered portion ranges from about 3–8 mm.

* * * * *